(12) United States Patent
Abe et al.

(10) Patent No.: US 8,687,454 B2
(45) Date of Patent: Apr. 1, 2014

(54) SEMICONDUCTOR STORAGE APPARATUS AND SEMICONDUCTOR INTEGRATED CIRCUIT

(75) Inventors: Jin Abe, Kawasaki (JP); Osamu Ishibashi, Kawasaki (JP); Masahiro Ise, Machida (JP)

(73) Assignee: Fujitsu Limited, Kawasaki (JP)

( * ) Notice: Subject to any disclaimer, the term of this patent is extended or adjusted under 35 U.S.C. 154(b) by 28 days.

(21) Appl. No.: 13/609,650

(22) Filed: Sep. 11, 2012

(65) Prior Publication Data
US 2013/0077426 A1   Mar. 28, 2013

(30) Foreign Application Priority Data
Sep. 26, 2011   (JP) ................... 2011-208380

(51) Int. Cl.
*G11C 8/00* (2006.01)
(52) U.S. Cl.
USPC ............ 365/230.01; 365/239; 365/241
(58) Field of Classification Search
USPC ............ 365/230.01, 230.03, 239, 241
See application file for complete search history.

(56) References Cited

U.S. PATENT DOCUMENTS

| | | | | |
|---|---|---|---|---|
| 5,861,879 A | * | 1/1999 | Shimizu et al. | 345/213 |
| 5,896,398 A | * | 4/1999 | Sekine | 714/720 |
| 2008/0094932 A1 | * | 4/2008 | Park et al. | 365/230.06 |

FOREIGN PATENT DOCUMENTS

JP   5-63164   3/1993

OTHER PUBLICATIONS

Patent Abstracts of Japan, Publication No. 05-063164, Published Mar. 12, 1993.

* cited by examiner

*Primary Examiner* — Ly D Pham
(74) *Attorney, Agent, or Firm* — Staas & Halsey LLP (57) ABSTRACT

In a semiconductor storage apparatus, an internal address generation unit generates, when receiving successive first and second external addresses, from the second external address an internal address for selecting any of the memory cells connected to bit lines and word lines except the bit line and word line connected to a memory cell to be selected according to the first external address. When receiving the successive external addresses, a memory cell connected to the same bit line and word line is not continuously selected, and erroneous readout due to rewriting of a value of the memory cell in a non-selected state is suppressed.

6 Claims, 11 Drawing Sheets

INTERNAL ADDRESS (COLUMN ADDRESS)

| | 00 | 01 | 10 | 11 |
|---|---|---|---|---|
| 000 | x0000 | | x0010 | |
| 001 | | x0101 | | x0111 |
| 010 | x1000 | | | |
| 011 | | | | |
| 100 | | x0001 | | x0011 |
| 101 | x0100 | | x0110 | |
| 110 | | | | |
| 111 | | | | |

INTERNAL ADDRESS (ROW ADDRESS)

FIG. 5B

INTERNAL ADDRESS (COLUMN ADDRESS)

| | 00 | 01 | 10 | 11 |
|---|---|---|---|---|
| 000 | 00000 / 10000 | 00001 / 10001 | 00010 / 10010 | 00011 / 10011 |
| 001 | 00100 / 10100 | 00101 / 10101 | 00110 / 10110 | 00111 / 10111 |
| 010 | 01000 / 11000 | 01001 / 11001 | 01010 / 11010 | 01011 / 11011 |
| 011 | 01100 / 11100 | 01101 / 11101 | 01110 / 11110 | 01111 / 11111 |
| 100 | | | | |
| 101 | | | | |
| 110 | | | | |
| 111 | | | | |

INTERNAL ADDRESS (ROW ADDRESS)

FIG. 6

|  | INTERNAL ADDRESS (COLUMN ADDRESS) | | | |
|---|---|---|---|---|
|  | 00 | 01 | 10 | 11 |
| 000 | x0000 |  | x0010 |  |
| 001 |  | x0101 |  | x0111 |
| 010 | ///// | ///// | ///// | ///// |
| 011 | ///// | ///// | ///// | ///// |
| 100 |  | x0001 |  | x0011 |
| 101 | x0100 |  | x0110 |  |
| 110 | ///// | ///// | ///// | ///// |
| 111 | ///// | ///// | ///// | ///// |

INTERNAL ADDRESS (ROW ADDRESS)

INTERNAL ADDRESS
(ROW ADDRESS)

INTERNAL ADDRESS
(COLUMN ADDRESS)

|  | 00 | 01 | 10 | 11 |
|---|---|---|---|---|
| 000 | 00000 | 00001 | 00010 | 00011 |
| 001 | 00100 | 00101 | 00110 | 00111 |
| 010 | 01000 | 01001 | 01010 | 01011 |
| 011 | 01100 | 01101 | 01110 | 01111 |
| 100 |  |  |  |  |
| 101 |  |  |  |  |
| 110 |  |  |  |  |
| 111 |  |  |  |  |

FIG. 9B

INTERNAL ADDRESS
(ROW ADDRESS)

INTERNAL ADDRESS
(COLUMN ADDRESS)

|  | 00 | 01 | 10 | 11 |
|---|---|---|---|---|
| 000 |  |  |  |  |
| 001 |  |  |  |  |
| 010 |  |  |  |  |
| 011 |  |  |  |  |
| 100 | 10000 | 10001 | 10010 | 10011 |
| 101 | 10100 | 10101 | 10110 | 10111 |
| 110 | 11000 | 11001 | 11010 | 11011 |
| 111 | 11100 | 11101 | 11110 | 11111 |

SEMICONDUCTOR STORAGE APPARATUS AND SEMICONDUCTOR INTEGRATED CIRCUIT

CROSS-REFERENCE TO RELATED APPLICATION

This application is based upon and claims the benefit of priority of the prior Japanese Patent Application No. 2011-208380, filed on Sep. 26, 2011, the entire contents of which are incorporated herein by reference.

FIELD

The embodiments discussed herein are related to a semiconductor storage apparatus and a semiconductor integrated circuit.

BACKGROUND

In a device in which accurate data is requested, such as a server for performing data processing or a telecom-related device, a semiconductor storage apparatus with high reliability is requested.

For the purpose of improving reliability of flash EEPROM (Electrically Erasable Programmable Read-Only Memory), there is conventionally used a method for dividing columns of a memory cell array into a plurality of segment columns and conducting only the selected segment column to a bit line.

Japanese Laid-open Patent Publication No. 05-63164

At the time of writing or reading data, voltage is applied to memory cells in a non-selected state except a selected memory cell. At this time, there is a problem that storage charges of the memory cells in a non-selected state gradually fluctuate and when the memory cell is read out, correct data fails to be read out.

SUMMARY

In one aspect of the embodiments, there is provided a semiconductor storage apparatus. This semiconductor storage apparatus includes a memory cell array configured to include a plurality of memory cells each connected to a bit line and a word line; and an internal address generation unit configured to generate, when receiving successive first and second external addresses, from the second external address an internal address for selecting any of the memory cells connected to bit lines and word lines except the bit line and word line connected to a memory cell to be selected according to the first external address.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, preferred embodiments of the present invention will now be described in detail below with reference to the accompanying drawings, wherein like reference numerals refer to like elements throughout.

Figure 1:
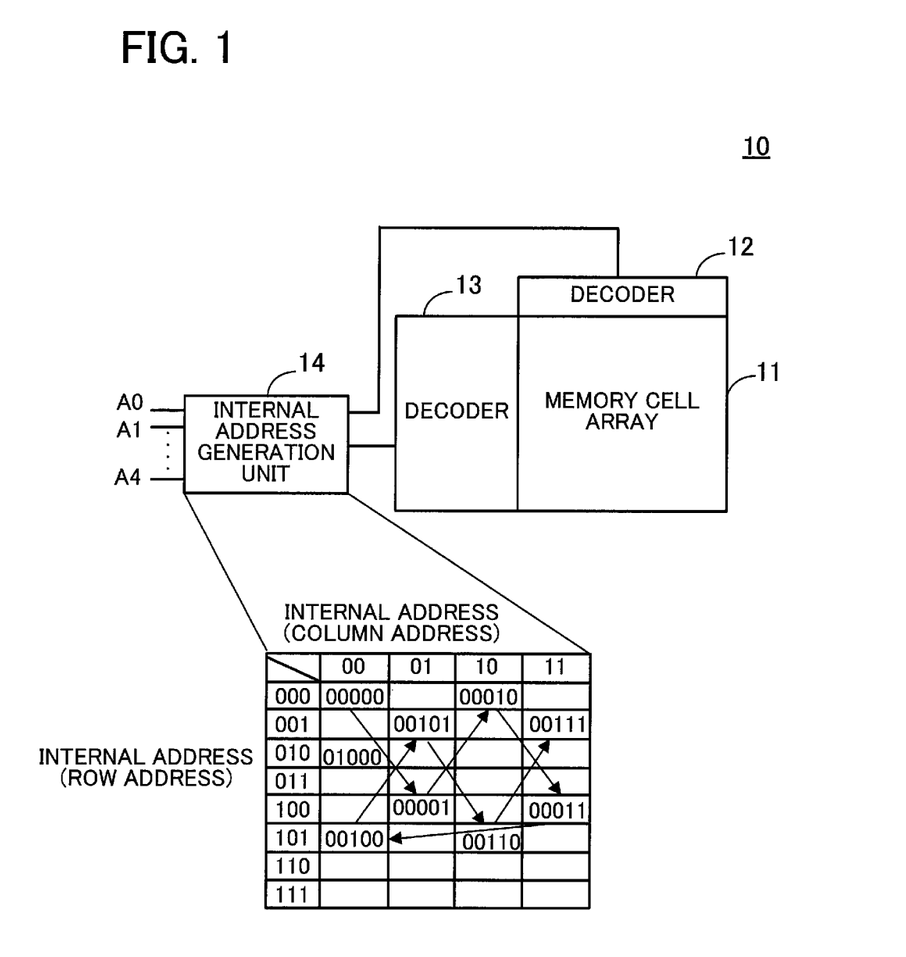
FIG. 1 illustrates one example of a semiconductor storage apparatus according to the present embodiment.

FIG. 1 illustrates one example of a semiconductor storage apparatus according to the present embodiment.

The semiconductor storage apparatus 10 includes a memory cell array 11, decoders 12 and 13, and an internal address generation unit 14.

The memory cell array 11 has a plurality of memory cells connected to bit lines and word lines.

According to internal addresses (column addresses) produced from the internal address generation unit 14, the decoder 12 selects a bit line connected to a memory cell to be accessed in the memory cell array 11. The decoder 12 then applies to each bit line a predetermined voltage according to a writing process or reading process.

According to internal addresses (row addresses) produced from the internal address generation unit 14, the decoder 13 selects a memory cell to be accessed in the memory cell array 11. The decoder 13 then applies to each word line a predetermined voltage according to a writing process or reading process.

The internal address generation unit 14 generates an internal address (a column address and a row address) based on the received external addresses. At the time of the writing process or reading process to the memory cell array 11, the internal address generation unit receives the successive external addresses (e.g., "00000" and "00001"). At this time, the internal address generation unit 14 generates from the following external address an internal address for selecting any of the memory cells connected to bit lines and word lines except the bit line and word line connected to the memory cell selected according to the previous external address.

In FIG. 1, an example in which an external address of 5 bits of A0, A1, . . . , A4 is supplied to the internal address generation unit 14 is illustrated. Values of the external address are produced from the outside through an external terminal (for example, provided for each bit of the external address) of the semiconductor storage apparatus 10 or a semiconductor integrated circuit including the semiconductor storage apparatus 10.

In FIG. 1, an example in which an internal address (a column address and a row address) is generated from the external address of 5 bits is further illustrated. The successive external addresses are indicated by arrow directions of FIG. 1. For example, in the case where "00000" is received as an external address, the internal address generation unit 14 generates a column address "00" and a row address "000". In the case where "00001" is received as an external address, the internal address generation unit 14 further generates a column address "01" and a row address "100".

Figure 2:
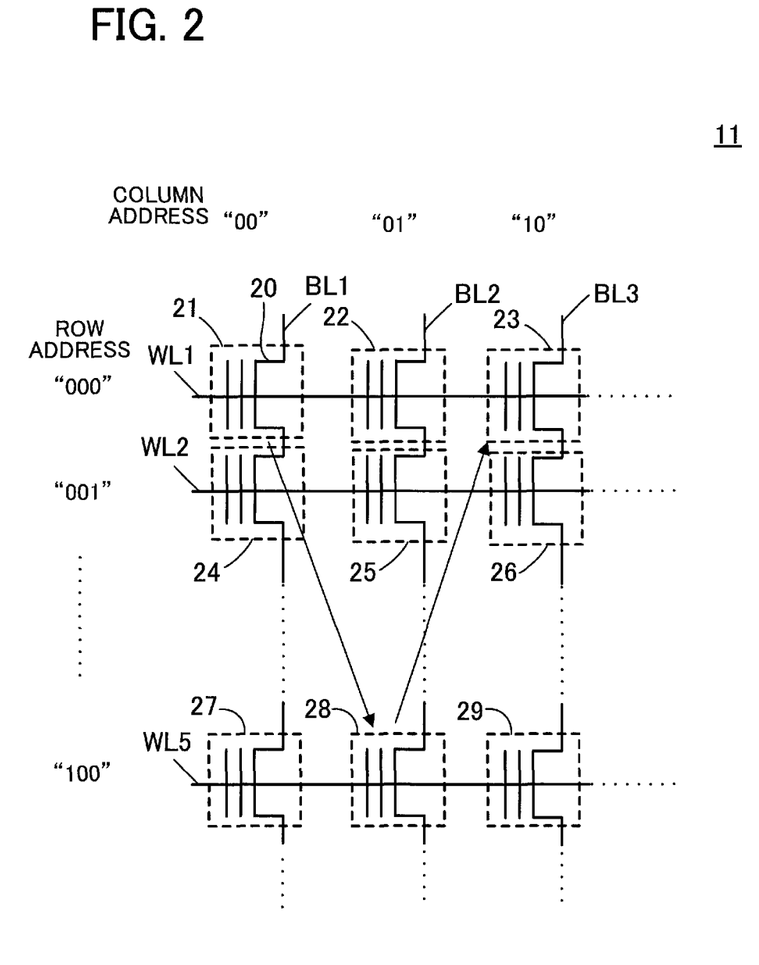
FIG. 2 illustrates an example of a part of a memory cell array.

FIG. 2 illustrates an example of a part of the memory cell array.

In FIG. 2, an example in which a memory cell array of a NAND flash memory is used as the memory cell array 11 is illustrated.

The memory cell array 11 has memory cells 21, 22, 23, 24, 25, 26, 27, 28, and 29 each including a cell transistor 20. The memory cells 21 to 23 are connected to a word line WL1, the memory cells 24 to 26 are connected to a word line WL2, and the memory cells 27 to 29 are connected to a word line WL5. Further, the memory cells 21, 24, and 27 are connected to a bit line BL1, the memory cells 22, 25, and 28 are connected to a bit line BL2, and the memory cells 23, 26, and 29 are connected to a bit line BL3.

Here, "00", "01", and "10" of FIG. 2 indicate a column address, and "000", "001", . . . , "100" indicate a row address. For example, when the column address indicates "00" and the row address indicates "000", the memory cell 21 is selected, and when the column address indicates "01" and the row address indicates "001", the memory cell 25 is selected.

One example of operations of the semiconductor storage apparatus 10 according to the present embodiment will be described below with reference to FIGS. 1 and 2.

At the time of writing process or reading process to the memory cell array 11, the internal address generation unit 14 receives the successive external addresses.

For example, when receiving a value "00000" of 5 bits in a binary number as an external address, the internal address generation unit 14 generates the column address "00" and the row address "000" as an internal address.

When the column address "00" and the row address "000" are received from the internal address generation unit 14, the decoders 12 and 13 select the memory cell 21 connected to the word line WL1 and the bit line BL1 in the memory cell array 11 as illustrated in FIG. 2.

Continuously, the internal address generation unit 14 receives a value "00001" of 5 bits in a binary number as an external address. At this time, the internal address generation unit 14 generates an internal address for selecting any of the memory cells connected to the bit lines and the word lines except the bit line BL1 and word line WL1 connected to the memory cell 21 selected by the external address "00000".

In the example of FIG. 1, the column address "01" and the row address "100" are generated as an internal address from the external address "00001". As a result, the memory cell 28 is selected in the memory cell array 11 illustrated in FIG. 2.

Continuously, the internal address generation unit 14 receives a value "00010" of 5 bits in a binary number as an external address and generates an internal address in the same manner. In the example of FIG. 1, from the external address "00010", the column address "10" and the row address "000" are generated as an internal address. As a result, the memory cell 23 is selected in the memory cell array 11 illustrated in FIG. 2.

As can be seen from the above description, the present embodiment provides the semiconductor storage apparatus 10 in which when receiving the successive external addresses, the internal address generation unit 14 generates an internal address so as not to select a memory cell connected to the same bit line and word line continuously.

In a flash memory, a pass disturbance and a program disturbance are known as a bad mode in which a threshold voltage of a memory cell in a non-selected state rises up at the time of writing process. When writing is repeated to the memory cell connected to the same bit line, the pass disturbance may occur. Further, when writing is repeated to the memory cell connected to the same word line, the program disturbance may occur.

The present embodiment provides the semiconductor storage apparatus 10 in which when receiving the successive external addresses, the internal address generation unit 14 generates an internal address so as not to select the memory cell connected to the same bit line and word line continuously, thereby suppressing an influence of the above disturbance. This feature of the present embodiment permits the semiconductor storage apparatus 10 to suppress erroneous readout due to rewriting of data in the memory cell in a non-selected state.

Also in the case of using a memory cell array of DRAM (Dynamic Random Access Memory), the same effect is further acquired. Specifically, the internal address generation unit 14 generates an internal address so as not to select the memory cell connected to the same bit line and word line continuously. Through the process, the internal address generation unit 14 suppresses erroneous readout due to rewriting of data in the memory cell of DRAM in a non-selected state.

Examples of the bad mode in a flash memory include a read disturbance. The read disturbance is a phenomenon that a threshold voltage of a memory cell in a non-selected state connected to a word line different from that connected to the selected memory cell rises up in the memory cell of the same block as that of the memory cell selected at the time of read operation. The above reason is that at the time of read operation, for example, a voltage of about 5 V is applied to the word line connected to the memory cell in a non-selected state. When uprise of the threshold voltage is repeated, a value of the memory cell in a non-selected state may be rewritten.

To suppress the problem, when receiving the successive external addresses, the internal address generation unit 14 preferably generates from the following external addresses an internal address for selecting a memory cell of a block different from that including the memory cell selected by the previous external address.

The block is a unit in which an erase operation is performed in a flash memory. Writing operations or read operations are separately performed in each block.

That is, at the time of read operation of memory cells in a certain block, for example, a voltage of about 5 V is applied to the word line connected to the memory cells in a non-selected state in the block. However, the above voltage is not applied to the word lines of the other blocks.

Figure 3:
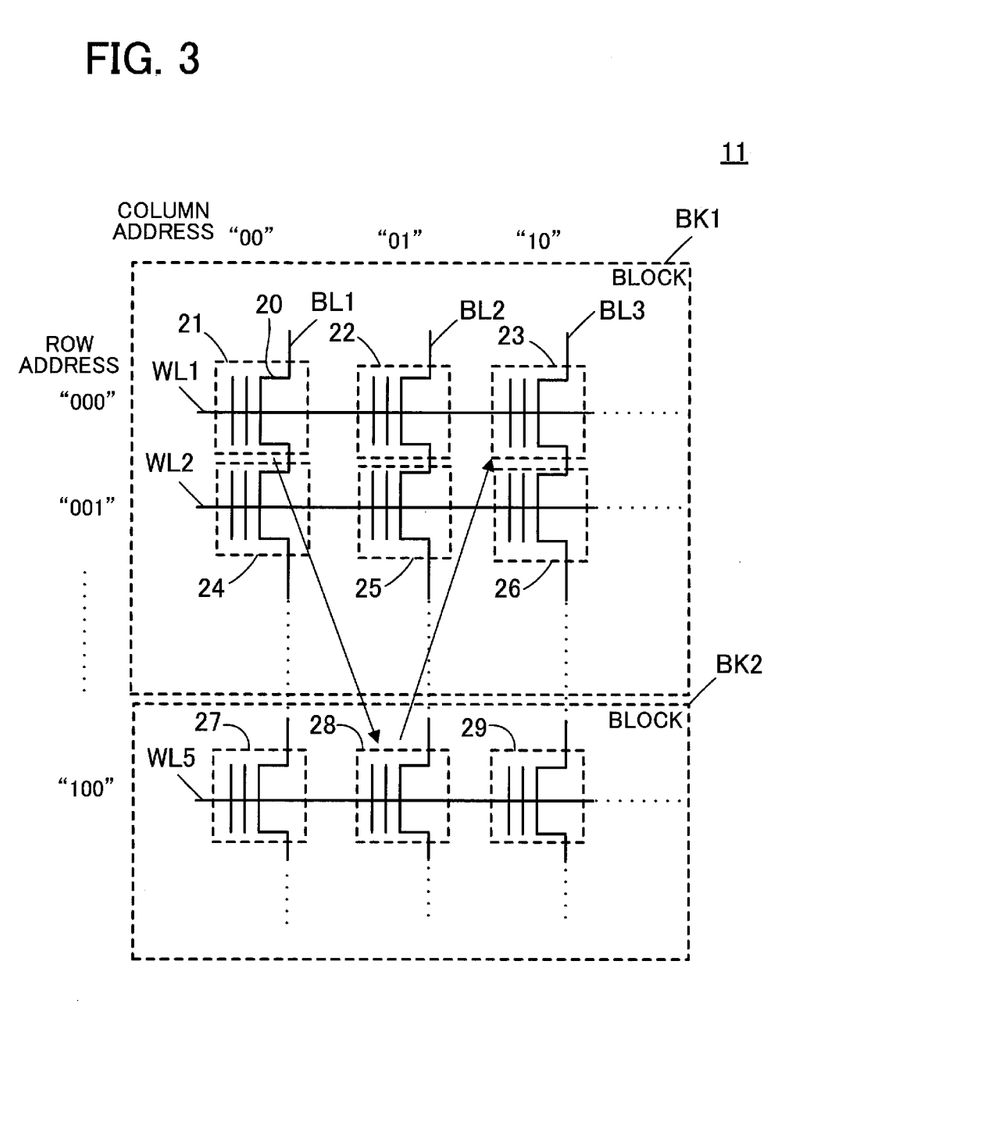
FIG. 3 illustrates one example in which a memory cell of a different block is selected.

FIG. 3 illustrates one example in which a memory cell of the different block is selected. In FIG. 3, the same circuit elements as those of FIG. 2 are indicated by the same reference numerals as in FIG. 2.

The memory cell array 11 has blocks BK1 and BK2.

For example, when receiving a value "00000" of 5 bits in a binary number as an external address, the internal address generation unit 14 generates the column address "00" and the row address "000" as an internal address.

When the column address "00" and the row address "000" are received from the internal address generation unit 14, the decoders 12 and 13 select the memory cell 21 of the block BK1 in the memory cell array 11 illustrated in FIG. 3.

Continuously, the internal address generation unit 14 receives a value "00001" of 5 bits in a binary number as an external address. At this time, the internal address generation unit 14 generates an internal address for selecting a memory cell of a block different from the block BK1 including the memory cell 21 selected by the external address "00000".

In the example of FIG. 1, from the external address "00001", the column address "01" and the row address "100" are generated as an internal address. Through the process, the memory cell 28 of the block BK2 is selected in the memory cell array 11 illustrated in FIG. 3.

Continuously, the internal address generation unit 14 receives a value "00010" of 5 bits in a binary number as an external address and generates an internal address in the same manner. In the example of FIG. 1, from the external address "00010", the column address "10" and the row address "000" are generated as an internal address. Through the process, the memory cell 23 of the block BK1 is selected in the memory cell array 11 illustrated in FIG. 3.

As can be seen from the above description, when receiving the successive external addresses, the internal address generation unit 14 generates an internal address so as not to select a memory cell of the same block continuously. As a result, not only the disturbance at the time of writing operation but also the read disturbance may be suppressed and erroneous readout may be suppressed due to rewriting of data of the memory cell in a non-selected state.

The above-described semiconductor storage apparatus 10 permits the internal address generation unit to generate an internal address, for example, as in illustrated in FIG. 1 and suppress various disturbances without changing the memory cell array itself.

One example of the internal address generation unit 14 which generates the above-described internal address will be described below.

Figure 4:
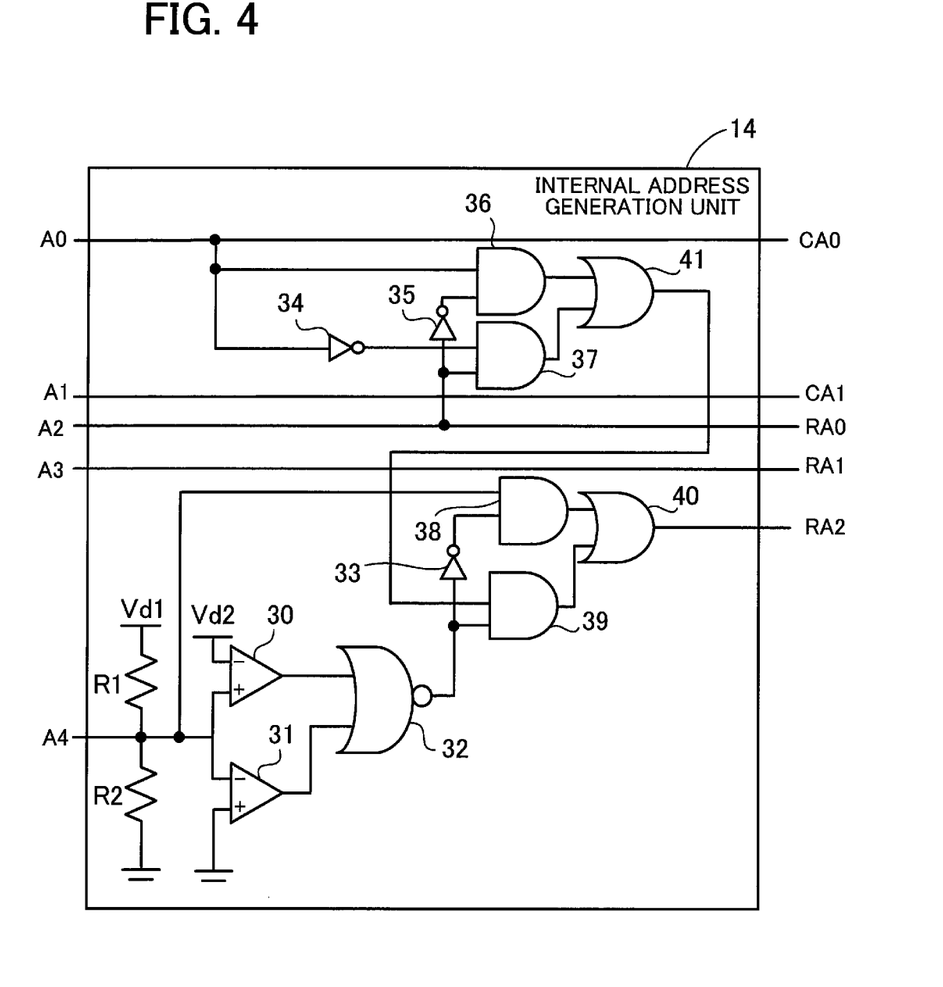
FIG. 4 illustrates one example of an internal address generation unit.

FIG. 4 illustrates one example of the internal address generation unit.

The internal address generation unit 14 has resistors R1 and R2, comparators 30 and 31, a NOR circuit 32, inverters 33, 34, and 35, AND circuits 36, 37, 38, and 39, and OR circuits 40 and 41.

The resistors R1 and R2 are serially connected to each other. To one terminal of the resistor R1, a voltage Vd1 is applied and one terminal of the resistor R2 is grounded. A highest-order bit (A4) of the external address is supplied to a node between the resistors R1 and R2. In addition, the node between the resistors R1 and R2 is connected to a non-inverting input terminal of the comparator 30, an inverting input terminal of the comparator 31, and one input terminal of the AND circuit 38. To an inverting input terminal of the comparator 30, a voltage Vd2 is applied. A non-inverting input terminal of the comparator 31 is grounded.

Output terminals of the comparators 30 and 31 are connected to an input terminal of the NOR circuit 32, respectively. An output terminal of the NOR circuit 32 is connected to an input terminal of the inverter 33 and to one input terminal of the AND circuit 39. An output terminal of the inverter 33 is connected to the other input terminal of the AND circuit 38.

Output terminals of the AND circuits 38 and 39 are connected to an input terminal of the OR circuit 40, respectively. From the OR circuit 40, a highest-order bit (RA2) of the row address is produced.

On the other hand, a lowest-order bit (A0) of the external address is produced from the internal address generation unit 14 as a lowest-order bit (CA0) of the column address. At the same time, the lowest-order bit (A0) of the external address is supplied to one input terminal of the AND circuit 36 and to one input terminal of the AND circuit 37 through the inverter 34. To the other input terminal of the AND circuit 37, a third bit (A2) from the bottom of the external address is supplied, and to the other input terminal of the AND circuit 36 through the inverter 35.

Output terminals of the AND circuits 36 and 37 are connected to an input terminal of the OR circuit 41, respectively. An output terminal of the OR circuit 41 is connected to the other input terminal of the above-described AND circuit 39.

Further, a second bit (A1) from the bottom of the external address is produced as a highest-order bit (CA1) of the column address, and the third bit (A2) from the bottom of the external address is produced as a lowest-order bit (RA0) of the row address. A fourth bit (A3) from the bottom of the external address is further produced as a second bit (RA1) from the bottom of the row address.

Suppose, for example, that the voltage Vd1 is 5 V and the voltage Vd2 is 3.3 V. In each logic gate of FIG. 3, a voltage value recognized as a High level ("1") is supposed to be 2.2 V or more, and a voltage value recognized as a Low level ("0") is supposed to be 0.8 V or less.

In the example illustrated in FIG. 4, when a value of the highest-order bit (A4) of the external address is invalid, resistance values of the resistors R1 and R2 are adjusted in such a manner that a signal level of a node potential between the resistors R1 and R2 is an intermediate level and an output of the NOR circuit 32 is equal to "1". When A4 is set to "0" or "1", the output of the NOR circuit 32 is equal to "0".

Examples of the time at which A4 is invalid include the time at which an external terminal (an external terminal of the semiconductor storage apparatus 10, or an external terminal of the semiconductor integrated circuit including the semiconductor storage apparatus 10) for receiving A4 is opened.

The intermediate level means that a signal level is not a High level ("1") and nor is it a Low level ("0"). As described above, in the case where a voltage value recognized as a High level ("1") is set to 2.2 V or more and a voltage value recognized as a Low level ("0") is set to 0.8 V or less, the intermediate level is variable from 0.8 to 2.2 V.

When the output of the NOR circuit 32 is set to "1", the internal address generation unit 14 generates an internal address as illustrated in FIG. 1 according to 4 bits (A0 to A3) of the external address.

In the example illustrated in FIG. 1, the highest-order bit A4 of the external address is set to "0"; further, when the external address A4 is invalid, the same internal address is generated by using the internal address generation unit 14 having circuits illustrated in FIG. 4.

Figure 5A:
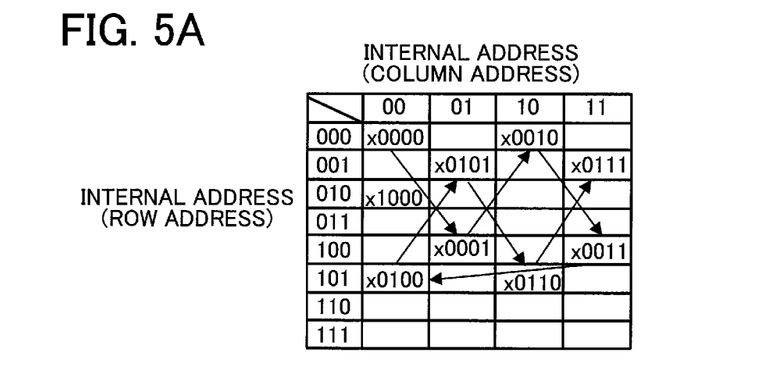
FIGS. 5A and 5B each illustrate an example of an internal address generated by an internal address generation unit having a circuit illustrated in FIG. 4.
Figure 5B:
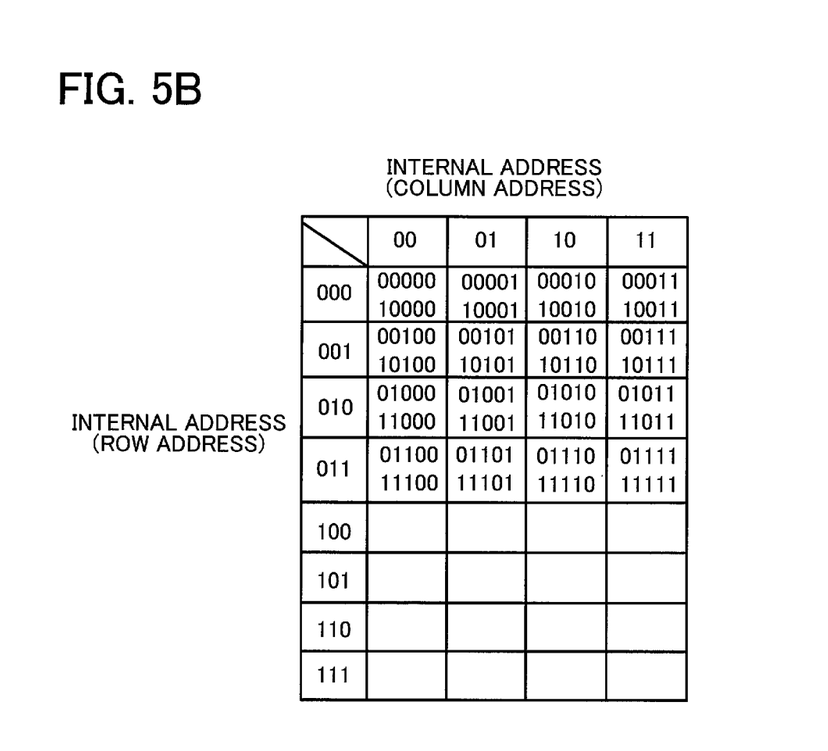

FIGS. 5A and 5B each illustrate an example of the internal address generated by the internal address generation unit having the circuits illustrated in FIG. 4.

In FIG. 5A, an example of the internal address generated in the case where the highest-order bit of the external address is invalid (described as "x") is illustrated. The same internal address as that of FIG. 1 is generated according to 4 bits (A0 to A3) of the external address.

In the case where a value of the highest-order bit A4 of the external address is set to "0" or "1", since the highest-order bit RA2 of the row address is fixed to "0", an internal address is generated as illustrated in FIG. 5B. In this case, a memory cell adjacent to a word line direction is selected according to the successive external addresses.

In short, by using the internal address generation unit 14 as illustrated in FIG. 4, a method for selecting a memory cell may be switched depending on whether a value of the highest-order bit A4 of the external address is invalid or valid.

The internal address generation unit 14 receives a fixed value of "0" or "1" as at least one bit except for the highest-order bit of the external address, thereby making invalid a part of the internal addresses.

Figure 6:
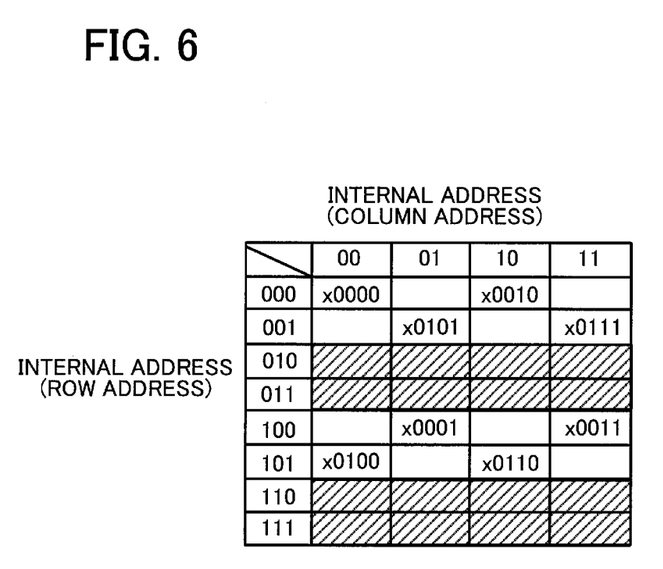
FIG. 6 illustrates an example of an internal address generated in the case where a value of A3 is fixed to "0" among bits of an external address.

FIG. 6 illustrates an example of the internal address generated in the case where a value of A3 is fixed to "0" among bits of the external address.

In FIG. 6, an example where the internal address is generated at the time when the highest-order bit of the external address is invalid ("x") and A3 as the next high-order bit is "0" is illustrated.

At this time, memory cells in positions of the row addresses "010", "011", "110", and "111" in which a second bit is set to "1" are not selected. The storable amount is limited; however, the number of times for selecting the memory cell connected to the same bit line may be reduced, and therefore an influence of the above-described pass disturbance may be suppressed.

Although not illustrated in the figure, in the case where a fixed value "0" is received as a value of A1, the internal address generation unit 14 illustrated in FIG. 4 fixes to "0" CA1 as a highest-order bit of the column address. In this case, memory cells in positions of the column addresses "10" and "11" are not selected. This feature of the internal address generation unit 14 reduces the number of times the memory cell connected to the same word line is selected, thereby suppressing an influence of the above-described program disturbance.

As can be seen from the above description, the internal address generation unit 14 receives a fixed value of "0" or "1" as at least one bit except for the highest-order bit of the external address, thereby making invalid a part of the internal addresses. This feature of the internal address generation unit 14 acquires a memory cell which is not partly selected and suppresses an influence of disturbance.

Incidentally, for example, the semiconductor storage apparatus 10 as illustrated in FIG. 1 is mounted on a semiconductor integrated circuit. In the case where a plurality of the semiconductor storage apparatus 10 are mounted, based on a state of the highest-order bit of the external address, the semiconductor integrated circuit selects either the semiconductor storage apparatus 10 which generates the internal address as illustrated in FIG. 5A or the semiconductor storage apparatus 10 which generates the internal address as illustrated in FIG. 5B.

Figure 7:
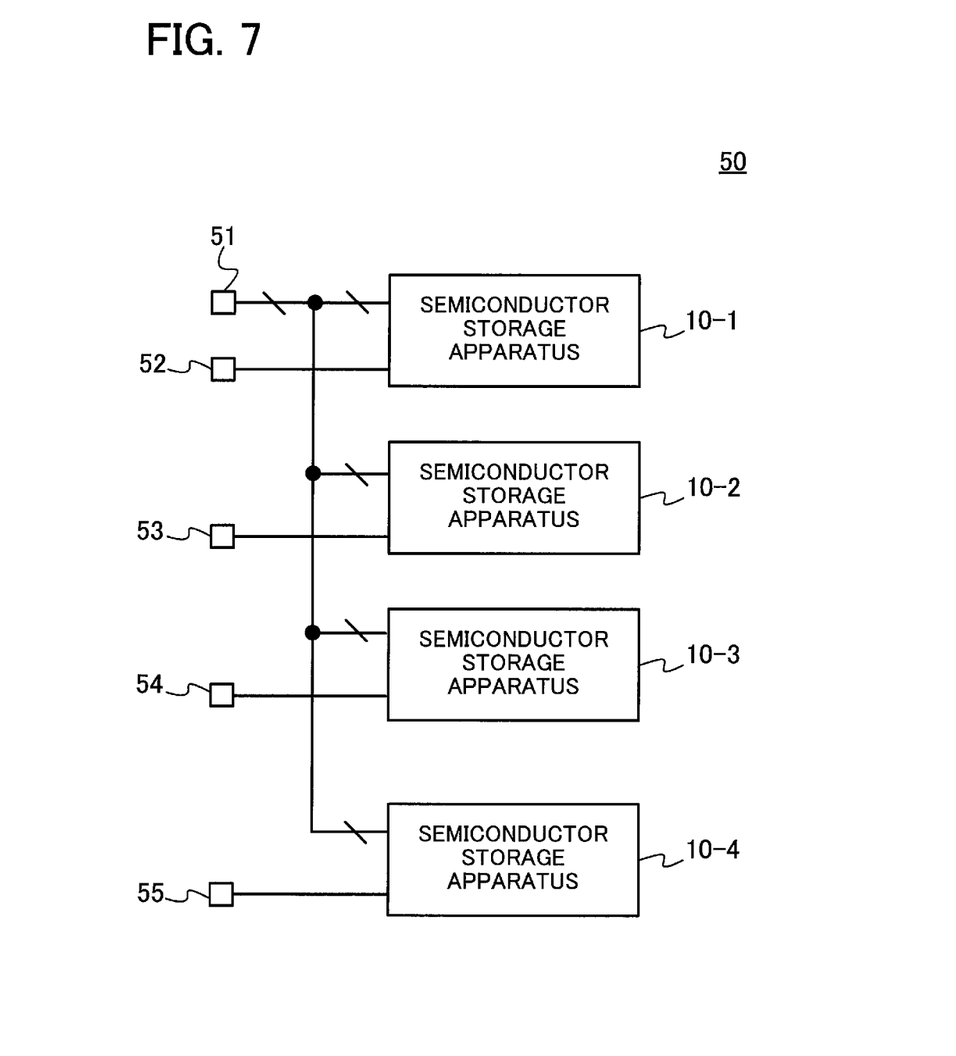
FIG. 7 illustrates one example of a semiconductor integrated circuit including a plurality of semiconductor storage apparatus.

FIG. 7 illustrates one example of the semiconductor integrated circuit including the plurality of semiconductor storage apparatus.

The semiconductor integrated circuit 50 includes external terminals 51, 52, 53, 54, and 55 for receiving an external address and the plurality of semiconductor storage apparatus 10-1, 10-2, 10-3, and 10-4.

By using a chip select signal (not illustrated), any of the semiconductor storage apparatus 10-1 to 10-4 are selected and used.

The semiconductor storage apparatus 10-1 to 10-4 includes the above-described internal address generation unit 14 as illustrated in FIG. 4, respectively. The external terminal 51 is provided according to the number of bits except for the highest-order bit of the external address, and supplies bits except the highest-order bit of the external address to the semiconductor storage apparatus 10-1 to 10-4.

The external terminals 52 to 55 are provided correspondingly to the semiconductor storage apparatus 10-1 to 10-4, respectively, and a value of the highest-order bit of the external address is set to each of the semiconductor storage apparatus 10-1 to 10-4. Suppose, for example, that a value of "1" or "0" is supplied to the external terminals 52 to 54. In this case, when the external terminal 55 is opened, only the internal address generation unit 14 of the semiconductor storage apparatus 10-4 generates the internal address as illustrated in FIG. 5A.

For example, with relation to an apparatus in which the frequency to be accessed is low among the semiconductor storage apparatus 10-1 to 10-4, "1" or "0" is preferably set as a highest-order bit of the external address. On the contrary, for example, when the frequency to be accessed is high in a certain semiconductor storage apparatus, the external terminal to which the highest-order bit of the external address is supplied in its own apparatus is preferably opened.

Among the semiconductor storage apparatus 10-1 to 10-4, for example, in the apparatus in which the frequency to be accessed is low and the internal address as illustrated in FIG. 5A is not generated, a part of the internal address generation unit may be improved as follows.

Figure 8:
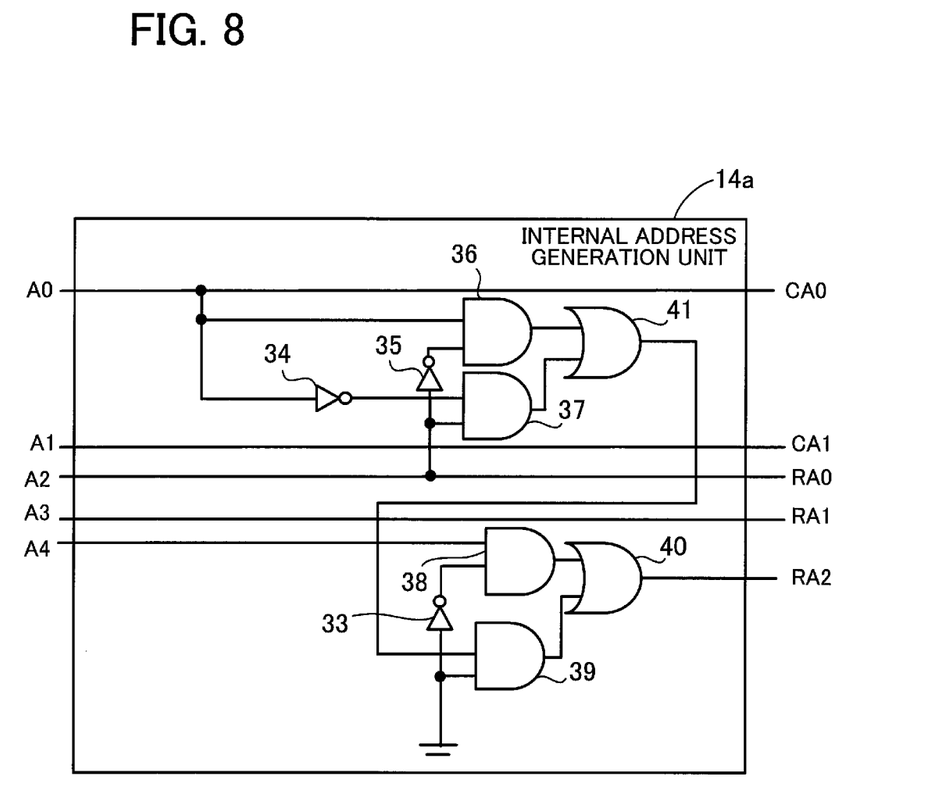
FIG. 8 illustrates a modification example of an internal address generation unit.

FIG. 8 illustrates a modification example of an internal address generation unit. In FIG. 8, the same circuit elements as those of the internal address generation unit 14 illustrated in FIG. 4 are indicated by the same reference numerals as in FIG. 4.

The internal address generation unit 14a illustrated in FIG. 8 has a circuit in which one terminal of the AND circuit 39 and an input terminal of the inverter 33 are grounded and A4 as a highest-order bit of the external address is directly supplied to one terminal of the AND circuit 38.

In the above-described circuit, a fixed value of "0" or "1" is received as A4, thus limiting an area to be used.

Figure 9A:
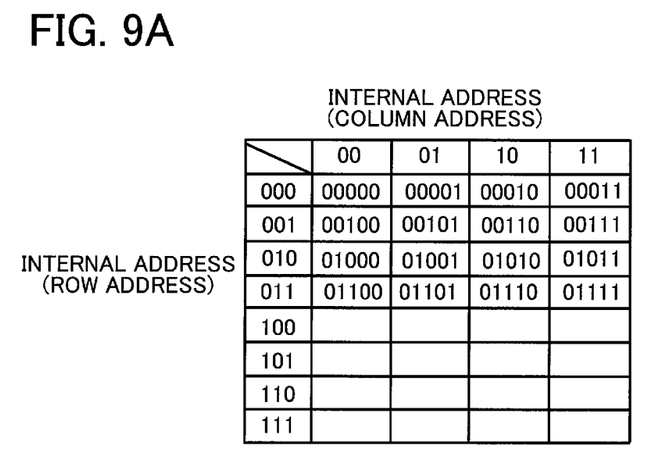
FIGS. 9A and 9B each illustrate an example of an internal address generated at the time when a value of A4 is fixed to "0" or "1"
Figure 9B:
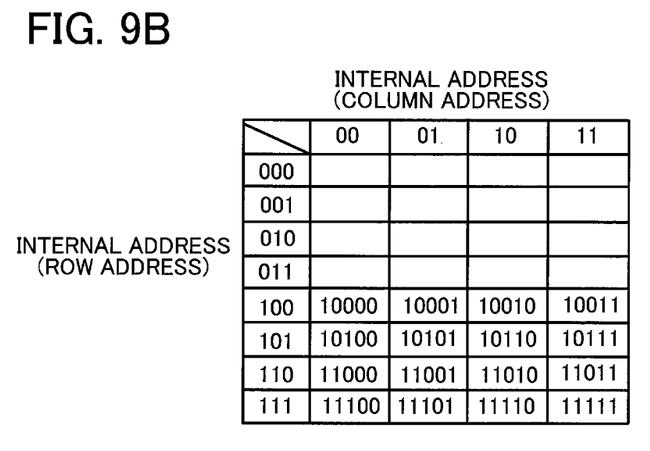

FIGS. 9A and 9B each illustrate an example of an internal address generated at the time when A4 is fixed to "0" or "1".

FIG. 9A illustrates an example of the internal address generated at the time when A4 is fixed to "0". When A4 is fixed to "0", the internal address generation unit 14a generates internal addresses according to values of the other bits (A0 to A3) of the external addresses. Specifically, in an example of FIG. 9A, any of the row addresses "000", "001", "010", and "011", and any of the column addresses "00", "01", "10", and "11" are generated. At this time, since the row addresses "100", "101", "110", and "111" are not generated, memory cells to be specified by these row addresses are not selected.

FIG. 9B illustrates an example of the internal address generated at the time when A4 is fixed to "1". When A4 is fixed to "1", the internal address generation unit 14a generates internal addresses according to values of the other bits (A0 to A3) of the external addresses. Specifically, in the example of FIG. 9B, any of the row addresses "100", "101", "110", and "111", and any of the column addresses "00", "01", "10", and "11" are generated. At this time, since the row addresses "000", "001", "010", and "011" are not generated, memory cells to be specified by these row addresses are not selected.

When using the internal address generation unit 14a, in the case where any of the memory cells selected by the internal address generated as illustrated in FIG. 9A are defective, for example, based on memory diagnosis processing, the internal address generation unit 14a receives a fixed value of "1" as A4 from the outside. The process permits the semiconductor storage apparatus to switch a memory cell to be used to a memory cell selected by the internal address generated as illustrated in FIG. 9B.

Much the same is true on a contrary case. In the case where any of the memory cells selected by the internal address generated as illustrated in FIG. 9B are defective, a fixed value of "0" is received as A4 from the outside. The process permits the semiconductor storage apparatus to switch a memory cell to be used to a memory cell selected by the internal address generated as illustrated in FIG. 9A.

The flash memory includes a NAND flash memory and a NOR flash memory, and the semiconductor storage apparatus 10 according to the present embodiment is applicable to both of the flash memories.

Figure 10:
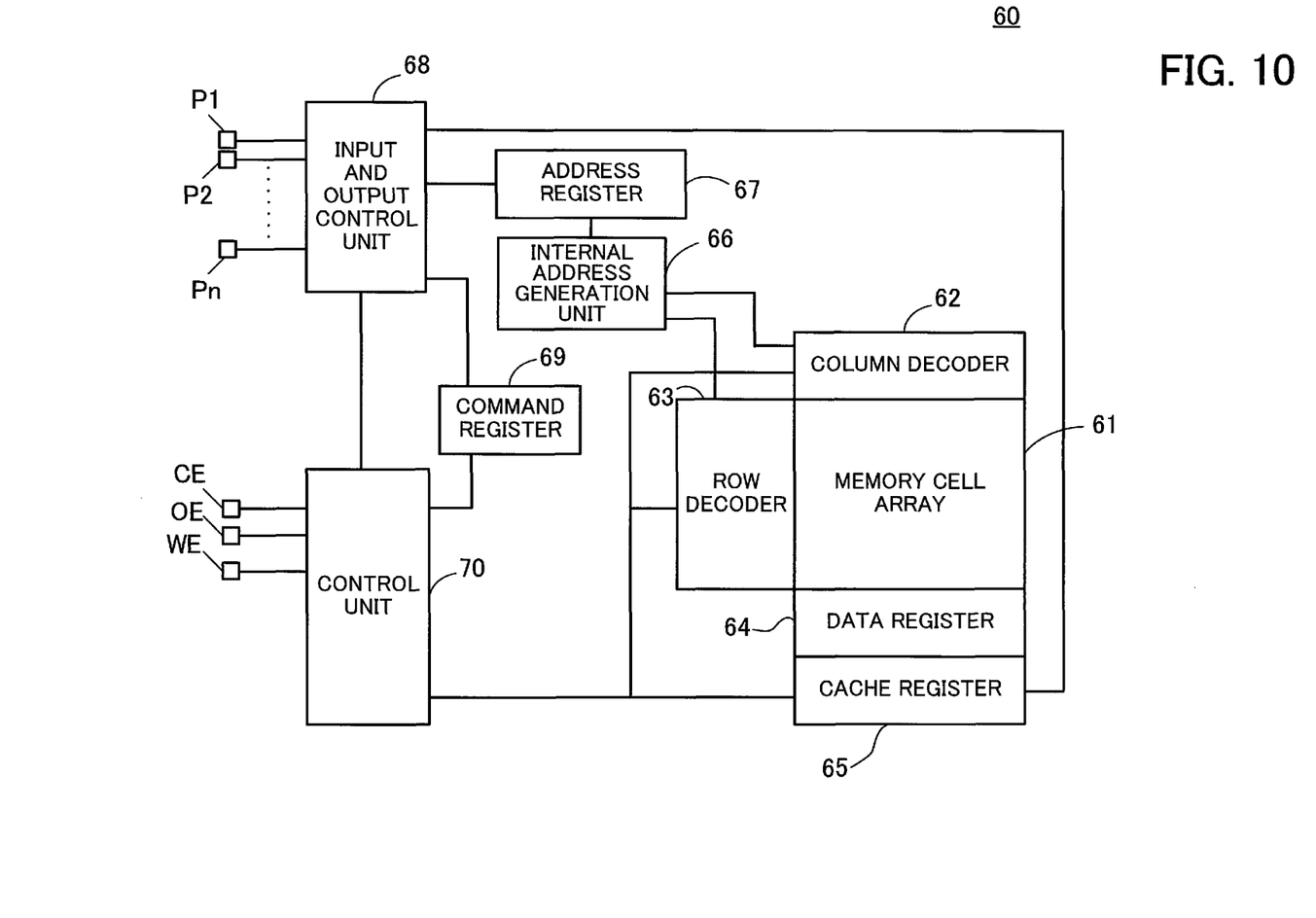
FIG. 10 illustrates one example of a NAND flash memory.

FIG. 10 illustrates one example of the NAND flash memory.

The NAND flash memory 60 illustrated in FIG. 10 has a memory cell array 61, a column decoder 62, a row decoder 63, a data register 64, and a cache register 65. The NAND flash memory 60 further has an internal address generation unit 66, an address register 67, an input and output control unit 68, a command register 69, and a control unit 70.

As illustrated in FIG. 2, the memory cell array 61 has a plurality of memory cells connected to bit lines and word lines.

According to the column addresses produced from the internal address generation unit 66, the column decoder 62 selects bit lines connected to memory cells to be accessed in the memory cell array 61. The column decoder 62 then applies a predetermined voltage according to writing or reading process to each bit line.

According to the row addresses produced from the internal address generation unit 66, the row decoder selects word lines connected to memory cells to be accessed in the memory cell array 61. The row decoder 63 then applies a predetermined voltage according to writing or reading process to each word line.

The data register 64 stores data to be written in a memory cell of the memory cell array 61 or data to be read out from a memory cell of the memory cell array 61.

The cache register 65 temporarily stores data to be written in a memory cell of the memory cell array 61 produced from the input and output control unit 68, or data to be read out from a memory cell of the memory cell array 61 produced from the data register 64.

The internal address generation unit 66 has, for example, the above-described circuit as illustrated in FIG. 4 and generates the internal addresses as illustrated in FIG. 5 according to the external address.

The address register 67 holds external addresses and supplies them to the internal address generation unit 66.

The input and output control unit 68 is connected to external terminals P1, P2, . . . , Pn, and controls the input and output of data to be written in the memory cell array 61, data to be read out from the memory cell array 61, or external addresses. Examples of the external terminals P1 to Pn include a terminal for inputting a value of each bit (A0 to A4) of the above-described external addresses and a terminal for inputting and outputting data or command information.

The command register 69 stores command information supplied through the input and output control unit 68.

Through external terminals CE, OE, and WE, the control unit 70 receives a chip enable signal, an output enable signal, and a write enable signal, respectively. According to the above-described signals and the command information stored in the command register 69, the control unit 70 then controls each unit of the NAND flash memory 60.

In the above-described NAND flash memory 60, in the case of applying the circuit as illustrated in FIG. 4 to the internal address generation unit 66, it generates the internal addresses as illustrated in FIG. 5 based on the external addresses. The internal address generation unit 66 supplies the generated column addresses to the column decoder 62, and the generated row addresses to the row decoder 63.

At this time, when an external terminal to supply a value of the highest-order bit (A4) of the external address is opened among the external terminals P1 to Pn, the internal address generation unit 66 generates the internal addresses as illustrated in FIG. 5A according to values (A0 to A3) of the bits of the other external addresses.

The process permits the semiconductor storage apparatus to suppress an influence of disturbance and erroneous readout.

Figure 11:
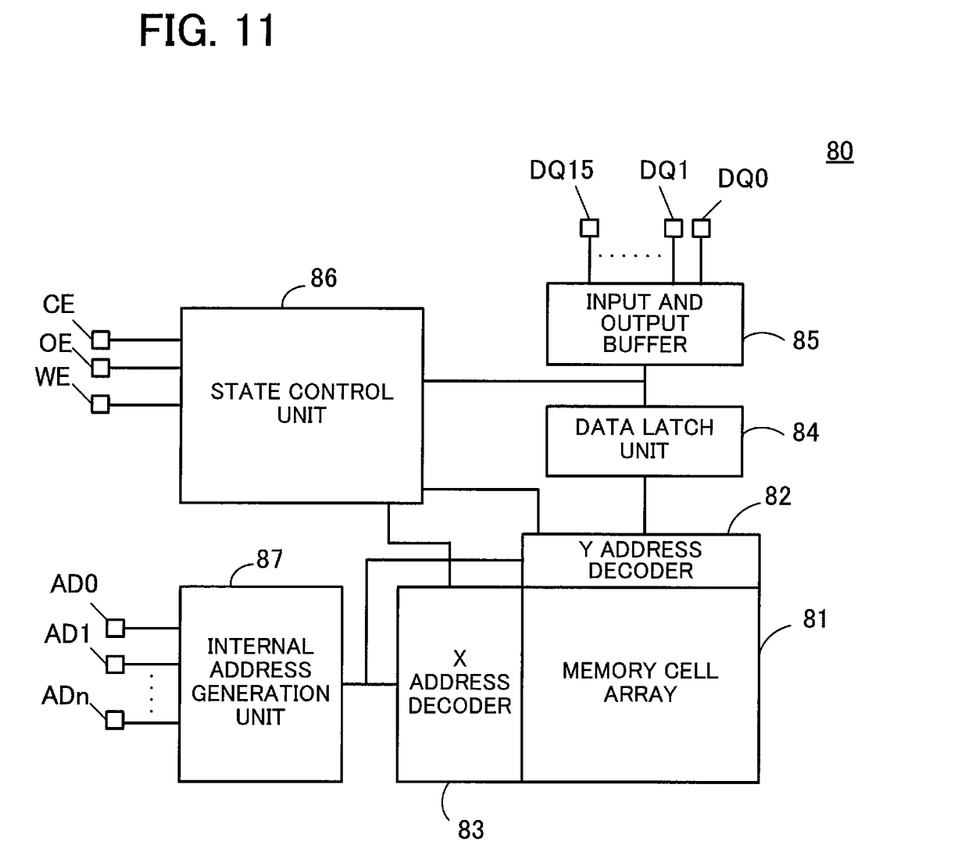
FIG. 11 illustrates one example of a NOR flash memory.

FIG. 11 illustrates one example of the NOR flash memory.

The NOR flash memory 80 illustrated in FIG. 11 has a memory cell array 81, a Y address decoder 82, an X address decoder 83, a data latch unit 84, an input and output buffer 85, a state control unit 86, and an internal address generation unit 87.

The memory cell array 81 has a plurality of memory cells connected to bit lines and word lines. Note that the memory cell array 81 has a memory cell structure different from that of the NAND flash memory illustrated in FIG. 2, and a source line for fixing source voltage of cell transistors of memory cells.

According to the column address (Y address) produced from the internal address generation unit 87, the Y address decoder 82 selects bit lines connected to memory cells to be accessed in the memory cell array 81. The Y address decoder 82 then applies a predetermined voltage according to writing or reading process to each bit line.

According to the row address (X address) produced from the internal address generation unit 87, the X address decoder 83 selects word lines connected to memory cells to be accessed in the memory cell array 81. The X address decoder 83 then applies a predetermined voltage according to writing or reading process to each word line.

The data latch unit 84 holds data to be written in a memory cell of the memory cell array 81 or data to be read out from a memory cell of the memory cell array 81.

The input and output buffer 85 is connected to external terminals DQ0, DQ1, . . . , DQ15, and holds data or command information to be input and output to and from the external terminals DQ0, DQ1, . . . , DQ15.

Through external terminals CE, OE, and WE, the state control unit 86 receives a chip enable signal, an output enable signal, and a write enable signal, respectively. According to the above-described signals and the command information produced from the input and output buffer 85, the state control unit 86 controls a state (READY/BUSY) of the NOR flash memory 80. The state control unit 86 then controls each unit of the NOR flash memory 80 according to the above state.

The internal address generation unit 87 is connected to external terminals AD0, AD1, . . . , ADn to receive external addresses.

In the case of applying the circuit as illustrated in FIG. 4 to the internal address generation unit 87, it generates the internal addresses as illustrated in FIG. 5 based on the external addresses to be received by the external terminals AD0 to ADn (n=4). The internal address generation unit 87 then supplies the generated column addresses to the Y address decoder 82, and the generated row addresses to the X address decoder 83.

At this time, when the external terminal AD4 to supply a value of the highest-order bit (A4) of the external address of 5 bits is opened, the internal address generation unit 87 generates the internal addresses as illustrated in FIG. 5A according to values (A0 to A3) of the bits of the other external addresses.

The process permits the semiconductor storage apparatus to suppress an influence of disturbance and erroneous readout.

The present embodiment provides the semiconductor storage apparatus 10 which is simultaneously applicable not only to the above-described flash memory but also to a semiconductor storage apparatus such as a DRAM.

According to the embodiments, one viewpoint of the semiconductor storage apparatus of the embodiments is described; however, this is simply one example and not limited to the above description.

For example, the generated internal address is not limited to the examples of FIGS. 1 and 5A. When receiving the successive external addresses, the internal address generation unit 14 preferably generates an internal address so as not to select a memory cell connected to the same bit line and word line continuously.

In the above description, in the case where the internal address generation unit 14 has the circuit as illustrated in FIG. 4, when a value of a highest-order bit of an external address is invalid, successive external addresses are received and the internal addresses as illustrated in FIG. 5A are generated.

However, in the case where a specified bit except a highest-order bit of an external address is invalid, when receiving successive external addresses, the internal address generation unit 14 may be changed to have a circuit which generates an internal address so as not to select a memory cell connected to the same bit line and word line continuously.

A plurality of bits of an external address may be made invalid.

The internal address generation unit 14 is not limited to the circuit illustrated in FIG. 4 and, for example, may be software such that the internal address as illustrated in FIG. 1 is produced according to the received external addresses.

In the example of FIG. 7, the semiconductor integrated circuit 50 having the plurality of semiconductor storage apparatus 10-1 to 10-4 is illustrated; further, may have one semiconductor storage apparatus.

The proposed semiconductor storage apparatus and semiconductor integrated circuit permit erroneous readout of a memory cell to be suppressed.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor storage apparatus comprising:
a memory cell array configured to include a plurality of memory cells each connected to a bit line and a word line; and
an internal address generation unit configured to generate, when receiving successive first and second external addresses, from the second external address an internal address for selecting any of the memory cells connected to bit lines and word lines except the bit line and word line connected to a memory cell to be selected according to the first external address.

2. The semiconductor storage apparatus according to claim 1, wherein:
the memory cell array includes a plurality of blocks in which reading or writing of data is separately performed; and
the internal address generation unit generates from the second external address an internal address for selecting a memory cell included in a block different from that including a memory cell to be selected according to the first external address.

3. The semiconductor storage apparatus according to claim 1, wherein the internal address generation unit generates, when a specific bit of an external address to be received is invalid, from the second external address an internal address for selecting any of the memory cells connected to bit lines and word lines except the bit line and word line connected to a memory cell to be selected according to the first external address.

4. The semiconductor storage apparatus according to claim 3, wherein among the received external addresses, at least one bit except for the specific bit is a fixed value of 0 or 1, and the internal address generation unit makes a part of the internal address invalid.

5. A semiconductor integrated circuit comprising:
a plurality of external terminals configured to receive an external address; and
a semiconductor storage apparatus including:
a memory cell array configured to include a plurality of memory cells each connected to a bit line and a word line; and
an internal address generation unit configured to generate, when receiving successive first and second external addresses, from the second external address an internal address for selecting any of the memory cells connected to bit lines and word lines except the bit line and word line connected to a memory cell to be selected according to the first external address.

6. The semiconductor integrated circuit according to claim 5, wherein:
the semiconductor storage apparatus is provided in plurality;
the internal address generation unit of each semiconductor storage apparatus generates, when a specific bit of the received external address is invalid, from the second external address an internal address for selecting any of the memory cells connected to bit lines and word lines except the bit line and word line connected to a memory cell to be selected according to the first external address; and
out of the plurality of external terminals, an external terminal to input the specific bit is provided in each of the semiconductor storage apparatus.

* * * * *